US012719339B2

(12) United States Patent
Nagare et al.

(10) Patent No.: US 12,719,339 B2
(45) Date of Patent: Aug. 25, 2026

(54) MULTILAYER CIRCUIT BOARD, DRIVE CONTROL DEVICE, AND MOTOR UNIT FOR ELECTRIC POWER STEERING

(71) Applicant: Mitsubishi Electric Corporation, Tokyo (JP)

(72) Inventors: Toshiki Nagare, Tokyo (JP); Hiroki Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 424 days.

(21) Appl. No.: 18/274,925

(22) PCT Filed: Apr. 28, 2021

(86) PCT No.: PCT/JP2021/016950
§ 371 (c)(1),
(2) Date: Jul. 28, 2023

(87) PCT Pub. No.: WO2022/230098
PCT Pub. Date: Nov. 3, 2022

(65) Prior Publication Data
US 2024/0088759 A1 Mar. 14, 2024

(51) Int. Cl.
*H02K 11/33* (2016.01)
*H05K 1/02* (2006.01)
*H02P 27/06* (2006.01)

(52) U.S. Cl.
CPC ........... *H02K 11/33* (2016.01); *H05K 1/0298* (2013.01); *H02K 2211/03* (2013.01); *H02P 27/06* (2013.01)

(58) Field of Classification Search
CPC .. H02K 11/33; H02K 2211/03; H05K 1/0298; H05K 1/0206; H05K 1/0263; H05K 1/0265; H02P 27/06
See application file for complete search history.

(56) References Cited

U.S. PATENT DOCUMENTS

2005/0237126 A1 10/2005 Babb et al.
2006/0255878 A1 11/2006 Babb et al.
(Continued)

FOREIGN PATENT DOCUMENTS

JP 2010-129732 A 6/2010
JP 2011-0830663 A 4/2011

OTHER PUBLICATIONS

Extended European Search Report issued May 29, 2024 in Application No. 21939259.4.
(Continued)

*Primary Examiner* — Steven T Sawyer
(74) *Attorney, Agent, or Firm* — Sughrue Mion, PLLC

(57) ABSTRACT

A multilayer circuit board formed by alternately stacking conductor layers and insulating layers. A power section and a control calculation section are disposed in different regions on the multilayer circuit board. The power section includes a drive current wiring for applying a current. The drive current wiring includes a same shape portion formed in a same shape in each of the conductor layers and a traversing portion in which a notch portion formed by notching a portion of the drive current wiring is formed at least on any one of the conductor layers. A signal wiring for transmitting a control signal of an inverter circuit mounted in the power section traverses the notch portion, and a dimension of a width of the traversing portion in a direction perpendicular to a longitudinal direction of the drive current wiring is larger than a dimension of a width of the same shape portion.

15 Claims, 10 Drawing Sheets

(56) References Cited

U.S. PATENT DOCUMENTS

| | | | | |
|---|---|---|---|---|
| 2018/0201302 | A1* | 7/2018 | Sonoda .................. | H02K 11/33 |
| 2019/0126972 | A1 | 5/2019 | Okamura et al. | |
| 2020/0079420 | A1* | 3/2020 | Takada ................. | B62D 5/0406 |
| 2020/0366168 | A1 | 11/2020 | Abe et al. | |
| 2020/0388637 | A1 | 12/2020 | Kikuchi et al. | |

OTHER PUBLICATIONS

Indian Office Action dated Nov. 27, 2025, issued in Indian application No. 202327063025.
Communication dated May 11, 2026, in Indian Application No. 202327063025.
Communication dated May 21, 2026, in Chinese Application No. 202180095743.X.

* cited by examiner

MULTILAYER CIRCUIT BOARD, DRIVE CONTROL DEVICE, AND MOTOR UNIT FOR ELECTRIC POWER STEERING

CROSS REFERENCE TO RELATED APPLICATIONS

This application is a National Stage of International Application No. PCT/JP2021/016950 filed Apr. 28, 2021.

TECHNICAL FIELD

The present disclosure relates to a multilayer circuit board, a drive control device, and a motor unit for electric power steering.

BACKGROUND ART

In the related art, a motor unit for electric power steering, which uses a brushless motor, has been disclosed in an electric power steering device that assists a steering force in accordance with an operation of a steering shaft of a vehicle (see, for example, Patent Document 1). This type of brushless motor has a stator wound by a plurality of coils and a rotor rotatably provided with respect to the stator. The rotation driving of the rotor is controlled by a drive control device (control unit) that controls power feeding to the coils.

This drive control device has a circuit board on which a plurality of electronic components are mounted. Patent Document 1 has proposed a circuit board in which a power wiring section (referred to as a power section below) in which a switching element for supplying a current is mounted, and a control wiring section (referred to as a control calculation section below) in which a control component that controls switching between on and off of a switching element is mounted. In the circuit board, conductor patterns (referred to as a wiring below) of the layers in the power section are formed in the same shape. With this configuration, it is possible to form a wiring with an increased cross-sectional area (referred to as a drive current wiring below) in order to apply a large current to the power section, and to supply a large current even when the switching element and the control component are mounted on the circuit board. As described above, Patent Document 1 discloses a motor unit capable of reducing the size of the drive control device by integrating a drive board and a control board into one circuit board.

CITATION LIST

Patent Document

Patent Document 1

Japanese Unexamined Patent Application, First Publication No. 2011-83063

SUMMARY OF INVENTION

Problem to be Solved by the Invention

In Patent Document 1, wirings of the layers of the drive current wiring formed in the power section are formed in the same shape in order to enable the supply of a large current. In a motor drive control device, a signal wiring for controlling a motor driving component such as a switching element mounted in an inverter circuit of the power section is required to be formed between driving components in the power section from a drive circuit in the control calculation section.

At this time, when the signal wiring is formed while avoiding the drive current wiring in order to suppress the heat generation in the drive current wiring and to maintain the same shape of the wiring, there is a problem that the board area increases.

When the signal wiring is formed to traverse the drive current wiring without avoiding the signal wiring in order to reduce the board area, the cross-sectional area of the drive current wiring at a portion at which the signal wiring traverses decreases, and the wiring resistance increases. As a result, heat generation in the wiring increases. Therefore, there is a problem that the board temperature rises, and thus disconnection and breakage due to the heat generation of the wiring occurs, and further the components mounted on the board are broken.

The present disclosure has been made to solve such problems. An object of the present disclosure is to provide a multilayer circuit board, a drive control device, and a motor unit for electric power steering capable of supplying a large current to a wiring and reducing a board area required for forming a signal wiring.

Means to Solve the Problem

According to the present disclosure, there is provided a multilayer circuit board. In the multilayer circuit board, a power section in which a current is applied to an inverter circuit in which a switching element is mounted and a control calculation section in which a control device that controls the switching element is mounted are disposed in different regions on the multilayer circuit board. The power section includes a drive current wiring for applying a current. The drive current wiring includes a same shape portion formed in a same shape in each of the conductor layers and a traversing portion in which a notch portion formed by notching a portion of the drive current wiring is formed at least on any one of the conductor layers. A signal wiring for transmitting a control signal of an inverter circuit mounted in the power section traverses the notch portion, and a dimension of a width of the traversing portion in a direction perpendicular to a longitudinal direction of the drive current wiring is larger than a dimension of a width of the same shape portion.

Effects of the Invention

According to the present disclosure, it is possible to provide a multilayer circuit board in which a signal wiring for controlling a switching element mounted in a power section is formed to traverse a drive current wiring while securing a cross-sectional area of the drive current wiring for applying a large current to the switching element. Therefore, it is possible to reduce the size of a drive control device including the multilayer circuit board, and to reduce the size of a motor unit for electric power steering, which includes the drive control device.

BRIEF DESCRIPTION OF DRAWINGS

FIG. 7 is a cross-sectional view of a grounding portion between the multilayer circuit board and a unit case according to Embodiment 1.

DESCRIPTION OF EMBODIMENTS

Embodiment 1

Figure 1:
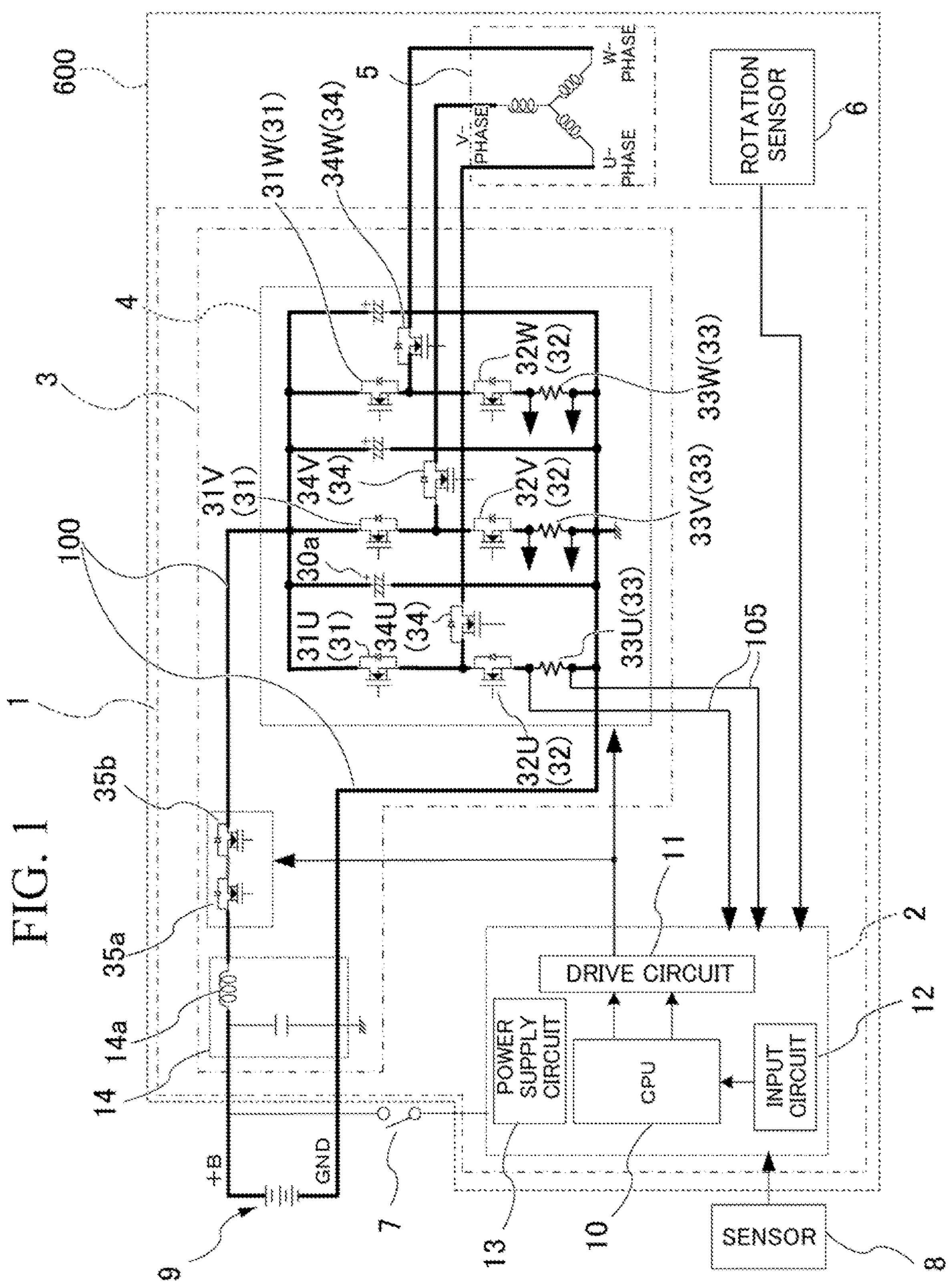
FIG. 1 is an overall circuit diagram including a motor unit for electric power steering according to Embodiment 1.

Embodiment 1 of the present disclosure will be described below with reference to FIGS. 1 to 7. In the drawings, the same or similar components are denoted by the same reference signs.

FIG. 1 shows an overall circuit diagram including a multilayer circuit board, a drive control device, and a motor unit for electric power steering according to Embodiment 1. As shown in FIG. 1, a motor unit 600 for electric power steering includes a drive control device 1, a motor 5, and a rotation sensor 6. An ignition switch 7, a sensor 8, and a battery 9 are connected to the motor unit 600 for electric power steering.

The drive control device 1 includes a control calculation section 2 having relatively small current consumption, and a power section 3.

The control calculation section 2 includes a CPU (control device) 10, a drive circuit 11, an input circuit 12, and a power supply circuit 13. The power section 3 includes an inverter circuit 4 that supplies and cuts off a current to the motor 5.

Figure 2:
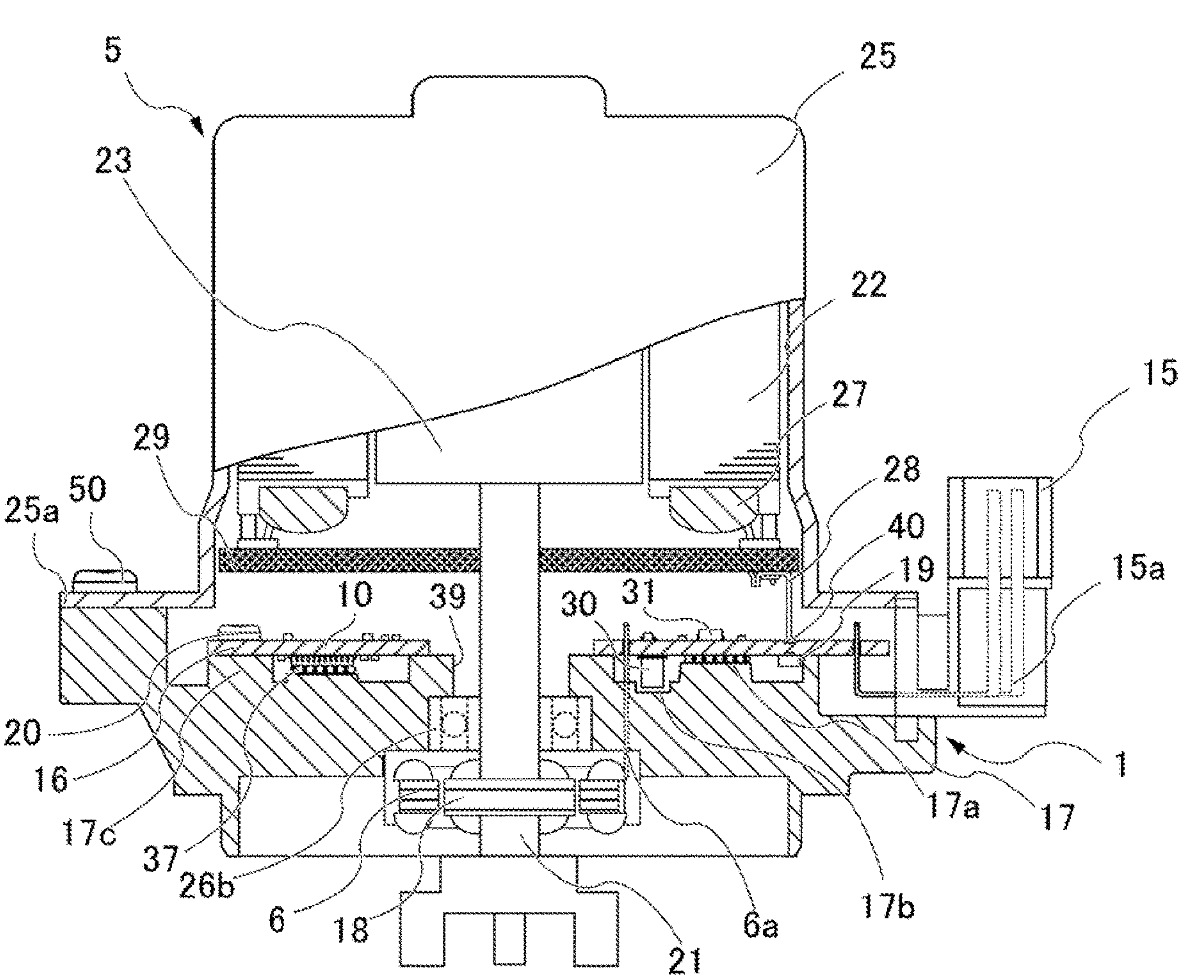
FIG. 2 is a cross-sectional view of the main parts showing a control drive device and a motor according to Embodiment 1.

The motor 5 is a three-phase brushless motor. For the brushless motor, the rotation sensor 6 that detects a rotation angle of the motor 5 is disposed near an output shaft 21 of the motor 5, as shown in FIG. 2.

As shown in FIG. 1, an inverter circuit 4 includes a bridge circuit, a motor relay switching element (switching element) 34, a shunt resistor 33 for current detection, and a capacitor 30*a*.

The bridge circuit includes a high-side switching element 31 and a low-side switching element 32 for supplying a current to each of three-phase coil groups. The motor relay switching element 34 can cut off the current to the motor 5.

Here, since each phase has the same circuit, coil names U, V, and W are attached as a subscript, to each of the high-side switching element 31, the low-side switching element 32, the shunt resistor 33, and the motor relay switching element 34. That is, FIG. 1 shows a high-side switching element 31U, a low-side switching element 32U, a shunt resistor 33U, and a motor relay switching element 34U for the U-phase, a high-side switching element 31V, a low-side switching element 32V, a shunt resistor 33V, and a motor relay switching element 34V for the V-phase, and a high-side switching element 31W, a low-side switching element 32W, a shunt resistor 33W, and a motor relay switching element 34W for the W-phase.

Power supply relays 35*a* and 35*b* that are capable of cutting off the current supply itself to the motor 5 are provided in the drive control device 1.

A field effect transistor (FET) as a semiconductor switching element is connected to the power supply relays 35*a* and 35*b*, as shown in FIG. 1 as an example. A noise filter 14 including a noise coil 14*a* is provided in the drive control device 1.

The battery 9 mounted on a vehicle, the ignition switch 7, and the sensor 8 are connected to the drive control device 1 as shown in FIG. 1.

The control calculation section 2 includes the input circuit 12. This input circuit 12 receives, as input signals, information from the sensor 8 such as a vehicle speed sensor and a torque sensor that detects the steering torque of a steering wheel, a detection result of a voltage or a current of each portion in the inverter circuit 4, a detection result of a rotation angle by the rotation sensor 6, and the like.

As a general operation, the control calculation section 2 calculates a current to be supplied to the coil of the motor 5 by the CPU 10 based on the input information from the sensor 8, which has been acquired via the input circuit 12, and controls switching of the inverter circuit 4 via the drive circuit 11.

Switching elements 31, 32, and 34 of each phase are driven by the drive circuit 11. This causes the desired current to flow through motor windings. Also, the current value supplied to the coil of the motor 5 is detected by the input circuit 12 via the shunt resistor 33 as the actual current value. The CPU 10 performs feedback control according to the deviation between the calculated value (target value) and the actual current value.

The CPU 10 also calculates the rotation position or speed of the motor by using rotation angle information from the rotation sensor 6. The calculated rotation position or speed of the motor is used to control the motor rotation.

Each structure will be described with reference to FIG. 2 in which the drive control device 1 having the above circuits and the motor 5 are integrated, and a portion of the integration is set as a cross-section. As shown in FIG. 2, the motor 5 is disposed above a circuit board 16 and the drive control device 1 is disposed below the circuit board 16. The motor 5 has a structure of being built in a motor case 25. This motor case 25 is a metal member (for example, made of iron).

As shown in FIG. 2, the motor 5 includes a rotor 23 and a stator 22.

In the rotor 23, a plurality of pole pairs of permanent magnets are disposed around the output shaft 21. The stator 22 is disposed with a gap in the rotor 23. A winding 27 is wound around the stator 22. The winding 27 is wound around each of the three phases. At an end portion of each phase, annular connection rings 29 are disposed to face the windings 27 for connection. Each of winding end portions 28 of three-phase windings (only one phase is shown) extends toward the drive control device 1 side. A rotation sensor rotor 18 is mounted near the output side of the output shaft 21.

A bearing (not shown) press-fitted onto the output shaft 21 of the rotor 23 is fitted to the top portion of the motor case 25. The output shaft 21, the rotor 23, the stator 22, the winding 27, the annular connection ring 29, and the winding end portions 28 are provided in the motor case 25.

Next, the drive control device 1 will be described. The drive control device 1 is disposed in an extending direction of the output shaft 21 of the motor 5 described above. The output shaft 21 passes through the central portion of the drive control device 1.

A through hole 39 through which the output shaft 21 can pass is formed in the unit case 17 of the drive control device 1. A portion of the outer periphery of the unit case 17 is notched, and a connector 15 is mounted. A power supply system terminal 15*a* connected to the battery 9 mounted on the vehicle and a signal terminal (not shown) connected to various sensors are built in the connector 15. The power supply system terminal 15*a* and the signal terminal are connected to the circuit board 16 built in the internal space of the unit case 17.

A female screw portion (not shown) is formed on the outer peripheral edge of the unit case 17. A hole (not shown) is provided in a portion of the motor case 25 where the drive control device 1 is grounded. The motor case 25 is fastened and fixed to the unit case 17 by inserting a bolt 50 into the hole and screwing the bolt 50 into the female screw portion (not shown) of the unit case 17.

The unit case 17 is made of metal, and is made of aluminum in consideration of heat dissipation and workability. In FIG. 2, a pair of first bearings (not shown) and a second bearing 26*b* for rotatably supporting the output shaft 21 are disposed at the upper portion and the lower portion of the rotor 23 in FIG. 2. The unit case 17 further includes a connection portion (not shown) with a speed reducer (not shown), a holding portion for the second bearing 26*b*, and a holding portion for the sensor 8 for detecting the rotation angle of the output shaft by using a rotation sensor rotor mounted on the output shaft 21. The sensor 8 is, for example, a resolver, and a resolver coil incorporated in the sensor 8 is electrically connected to the circuit board 16.

Thus, the outer shape of the drive control device 1 is configured by the metal unit case 17 and a resin portion of the connector 15. Due to the structure described above, the unit case 17 has a role of covering the drive control device 1 and can also be referred to as a housing.

Figure 3A:
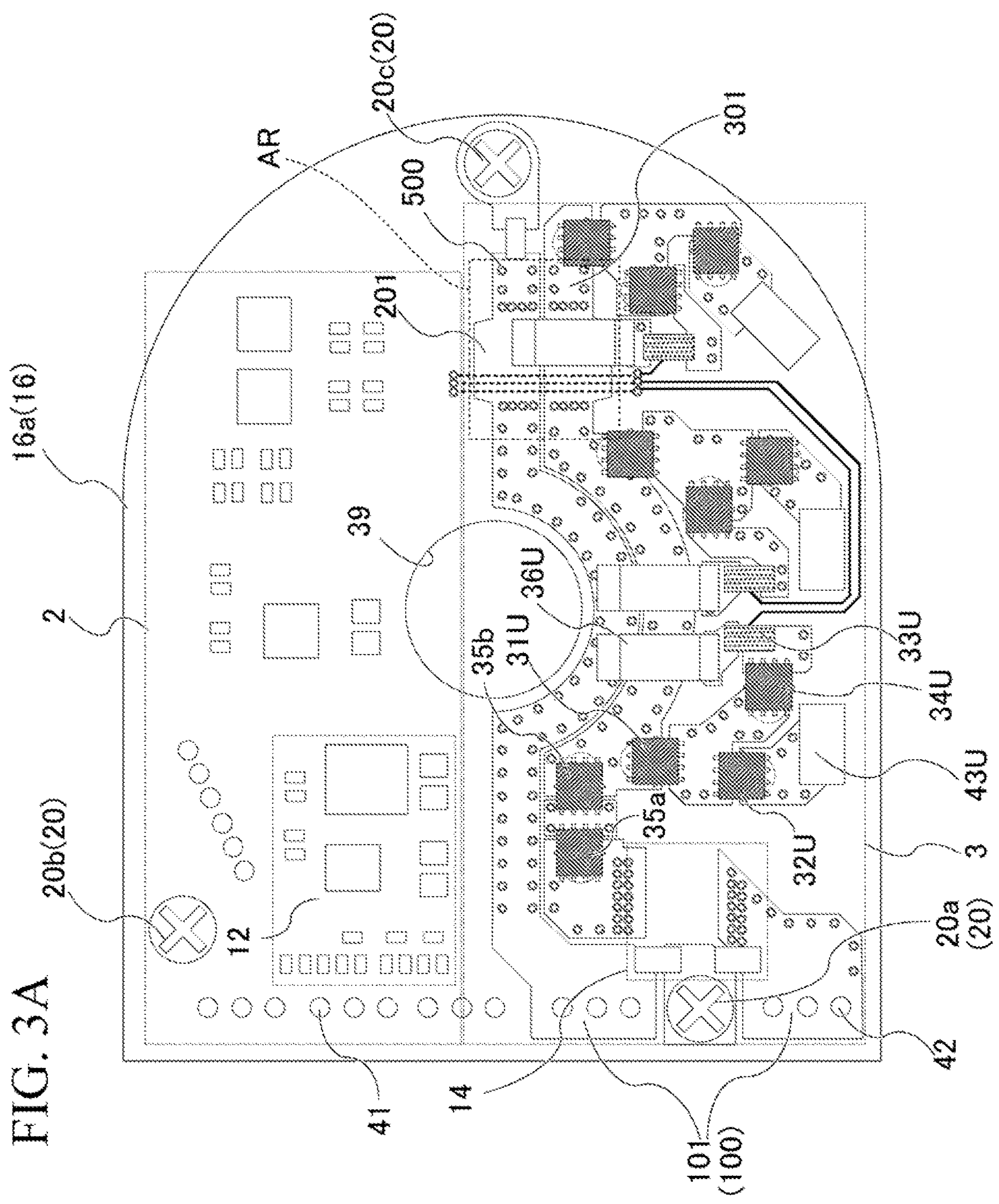
FIG. 3A is a plan view of each layer of a multilayer circuit board according to Embodiment 1.
Figure 3B:
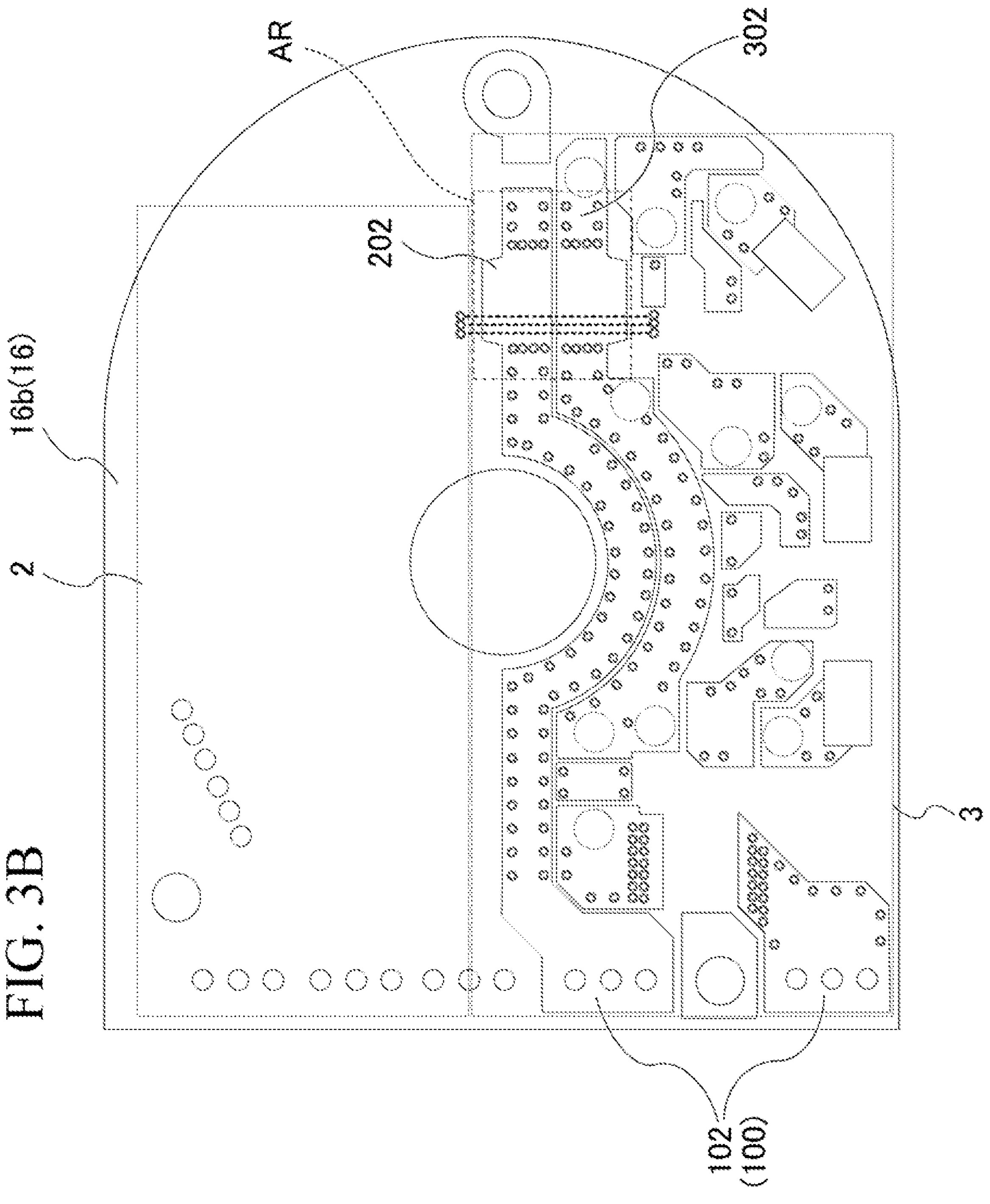
FIG. 3B is a plan view of each layer of the multilayer circuit board according to Embodiment 1.

Further, the circuit board 16 is fastened and fixed by screwing a bolt 20 into a female screw portion (not shown) formed on an outer wall portion 17*c* of the unit case 17. As shown in FIG. 3A, bolts 20*a*, 20*b*, and 20*c* are provided at a plurality of locations around the circuit board 16. The circuit board 16 is assembled in the unit case 17 with the bolts 20*a*, 20*b*, and 20*c*. As a result, it is possible to prevent floating of the board when the circuit board 16 is assembled. Further, as shown in FIG. 2, since the portion of the unit case 17 other than the outer wall portion 17*c* is formed lower than the outer wall portion 17*c*, there is a space between the unit case 17 and the circuit board 16.

Furthermore, the upper surface of a protruding portion 17*a* of the unit case 17, which faces the power section 3 of the circuit board 16 is formed to be lower than the upper surface of the unit case 17 to which the circuit board 16 is fixed and to be higher than a portion facing the control calculation section 2. Thus, a gap is formed between the circuit board 16 and the protruding portion 17*a*. A heat dissipation member 37 having high thermal conductivity is disposed in this gap. Heat generated in the power section 3 of the circuit board 16 is transferred to the unit case 17 by the heat dissipation member 37.

Further, the unit case 17 is formed with a recess portion 17*b*. A space is formed by the circuit board 16 and the recess portion 17*b*. The capacitor 30 is mounted at the lower portion of the circuit board 16 and disposed in the recess portion 17*b*. As described above, it is also possible to dispose the heat dissipation member 37 in this space to dissipate the heat generated by the capacitor 30 to the unit case.

Figure 3C:
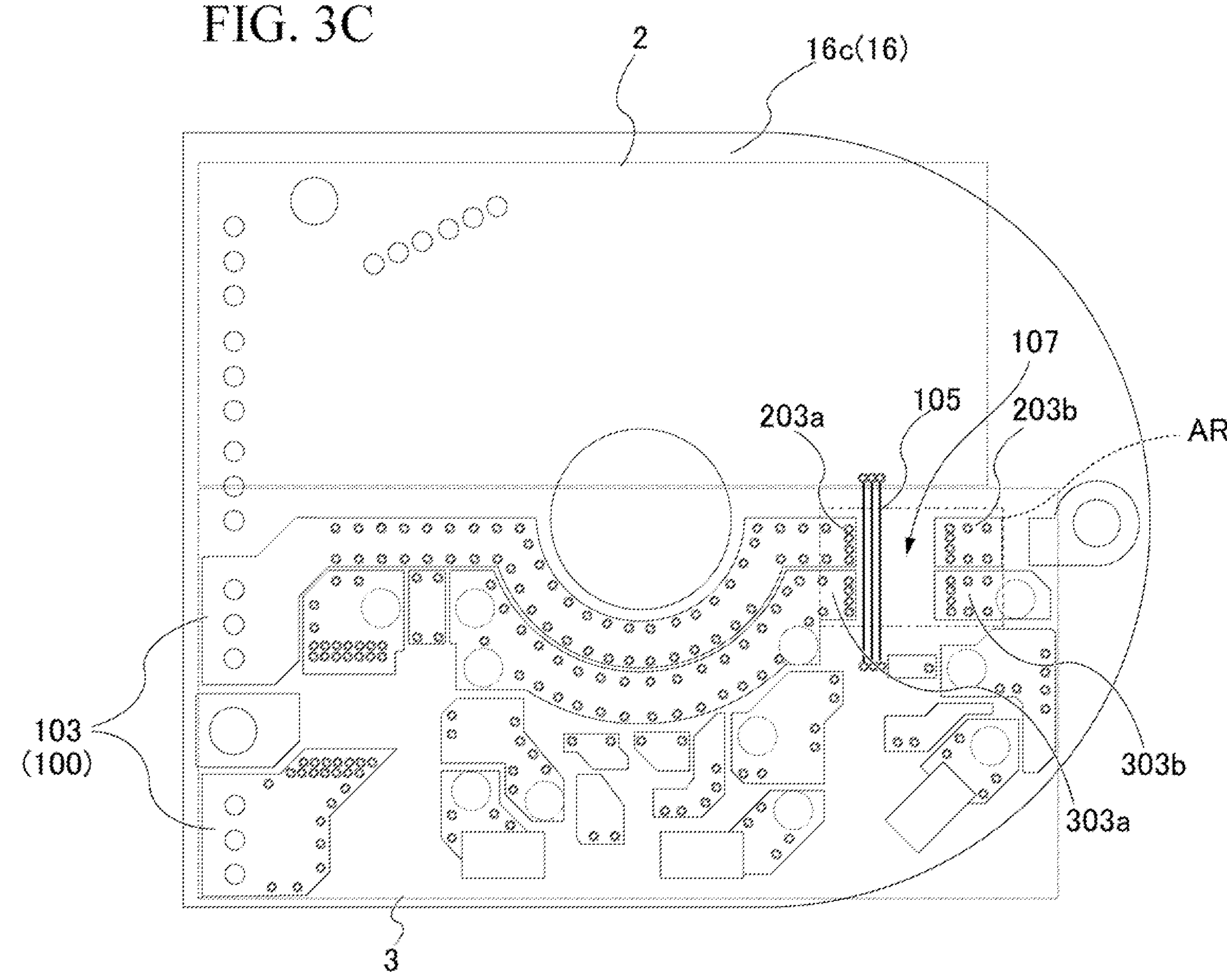
FIG. 3C is a plan view of each layer of the multilayer circuit board according to Embodiment 1.
Figure 3D:
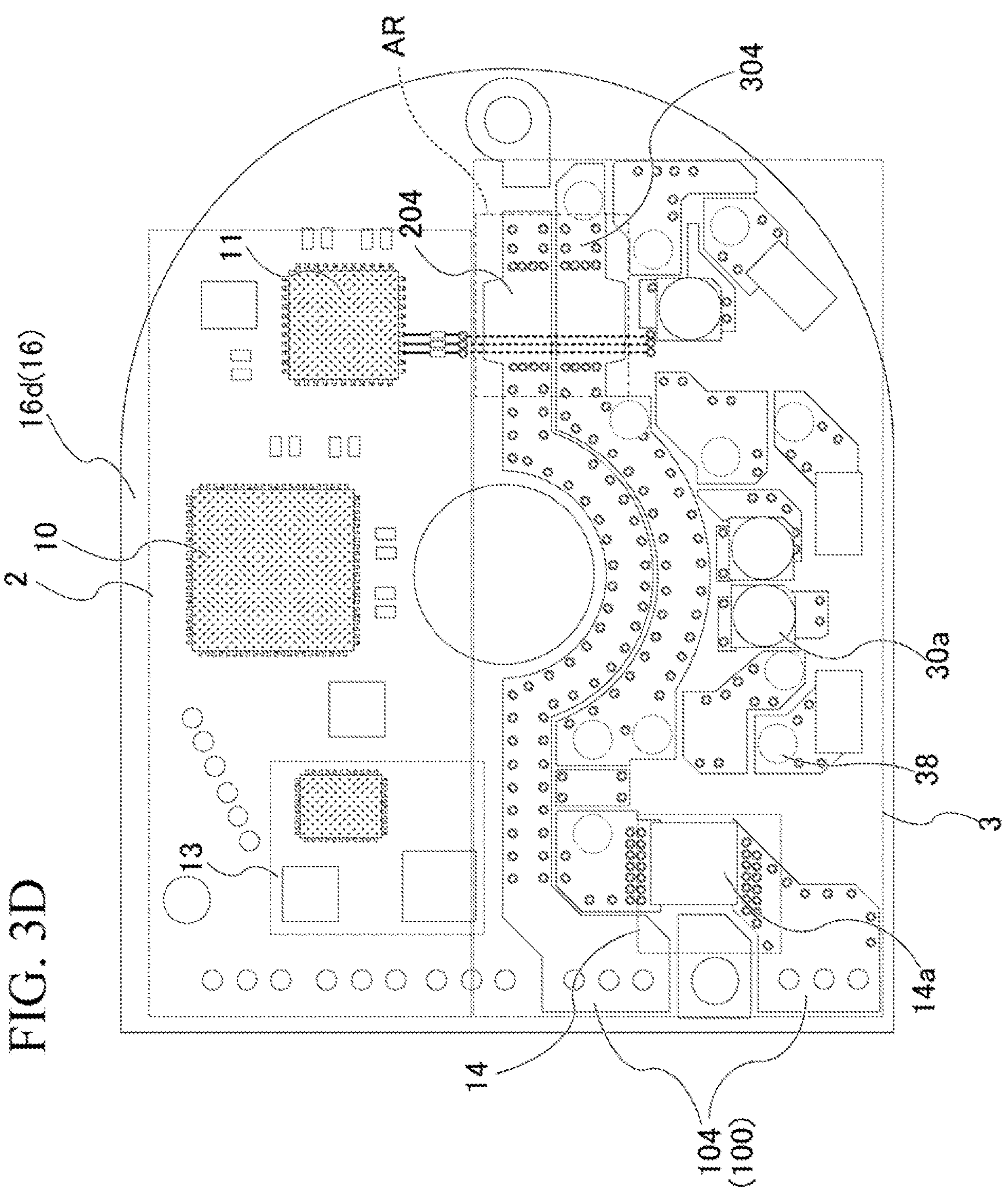
FIG. 3D is a plan view of each layer of the multilayer circuit board according to Embodiment 1.

As shown in FIG. 3D, a through hole is formed in the circuit board 16, and a metal body 38 is buried in this through hole. The through hole is formed below the switching elements 31, 32, 34, and 35. In the present embodiment, the through hole is formed at positions (directly below) facing the switching elements 31, 32, 34, and 35. With this configuration, in the present embodiment, it is possible to enhance the heat dissipation of the switching elements 31, 32, 34, and 35 mounted on the power section 3.

When heat spreaders are provided in the switching elements 31, 32, 34, and 35, the metal body 38 may be provided below (directly below) the heat spreaders.

The position of the metal body 38 is not limited to the above configuration, and the metal body 38 may be positioned below the switching elements 31, 32, 34, and 35. For example, a configuration in which a through hole is formed around the positions facing the switching elements 31, 32, 34, and 35 or around the heat spreader to dissipate the heat may be made.

Next, the multilayer circuit board 16 will be described. The multilayer circuit board 16 is formed by alternately stacking conductor layers and insulating layers. The conductor layers are referred to as a first layer to a fourth layer in order from the upper side of FIG. 2. An insulating layer 109 is provided between the conductor layers (see FIG. 4). In Embodiment 1, a multilayer circuit board using glass epoxy resin as the insulating layer is used. The number of layers of the multilayer circuit board 16 is not limited to four layers, and may be three layers or less or five layers or more. Also, each layer may be a substrate made of a different material. In addition, the layer used in the present specification means the above conductor layer.

As shown in FIG. 2, the circuit board 16 includes a through hole 39 for passing the output shaft 21 and a through hole 40 for passing a conductive member. In Embodiment 1, the winding end portion 28 is inserted through the through hole 40. Further, the winding end portion 28 is electrically connected to the circuit board 16 by being connected to a relay member 19 solder-connected to the circuit board 16.

The circuit board 16 has a four-layer structure, as shown in FIGS. 3A to 3D. The circuit board 16 includes a first layer 16*a*, a second layer 16*b*, a third layer 16*c*, and a fourth layer 16*d* in order from the upper side in FIG. 2. The control calculation section 2 having relatively small current consumption is disposed on the upper side of the circuit board 16 in FIGS. 3A to 3D. A group 41 of through holes through which the signal terminals of the sensor 8 of the connector 15 are inserted are formed at positions corresponding to the control calculation section 2 of the circuit board 16.

The power section 3 including the inverter circuit 4 for supplying and cutting off the current to the motor 5 is disposed below the circuit board 16 in FIGS. 3A to 3D. As described above, the control calculation section 2 and the power section 3 are provided in different regions on the circuit board 16. A group 42 of through holes through which power supply system terminals of the connector 15 are inserted are formed at positions corresponding to the power section 3 of the circuit board 16.

The control calculation section 2 includes the CPU 10, the drive circuit 11, the input circuit 12, and the power supply circuit 13. Signals from the sensor 8 handled by the control calculation section 2 are greatly affected by noise generated from the power section 3 that applies a large current. Thus, when the control calculation section 2 and the power section 3 are formed on the same board, it is preferable to separate the control calculation section 2 and the power section 3 from each other. In Embodiment 1, the control calculation section 2 and the power section 3 are disposed separately on the upper side and the lower side of the circuit board 16, as shown in FIGS. 3A to 3D.

The main component of the power section 3 is the inverter circuit 4 that supplies and cuts off the current to the motor 5. The inverter circuit 4 controls the switching elements 31 to 32 to turn on/off, thereby selectively supplying a drive current to each phase of the motor 5 to drive the motor 5.

The power section 3 further includes a drive current wiring 100. Since the current value of a drive current for driving the motor 5 is large, a large current is applied to the drive current wiring 100. In FIG. 1, the drive current wiring 100 is indicated by a thick line, and includes a wiring connected to the external battery 9 in the power section 3, a wiring connected to the motor 5, and the like. As shown in FIGS. 3A to 3D, the drive current wirings of the layers 16*a* to 16*d* are referred to as a wiring 101, a wiring 102, a wiring 103, and a wiring 104 in order from the first layer.

In Embodiment 1, as shown in FIG. 1, the through hole 40 is formed directly above the relay member 19 which is a connection portion between the circuit board 16 and the winding end portion 28. It is preferable not to mount electronic components around the through holes 40 in order to avoid damage to the electronic components due to stress generated during assembly of the motor. Thus, in order to increase the effective component mounting area of the circuit board 16, the through hole 40 is disposed in the outer peripheral portion of the circuit board 16.

Figure 4:
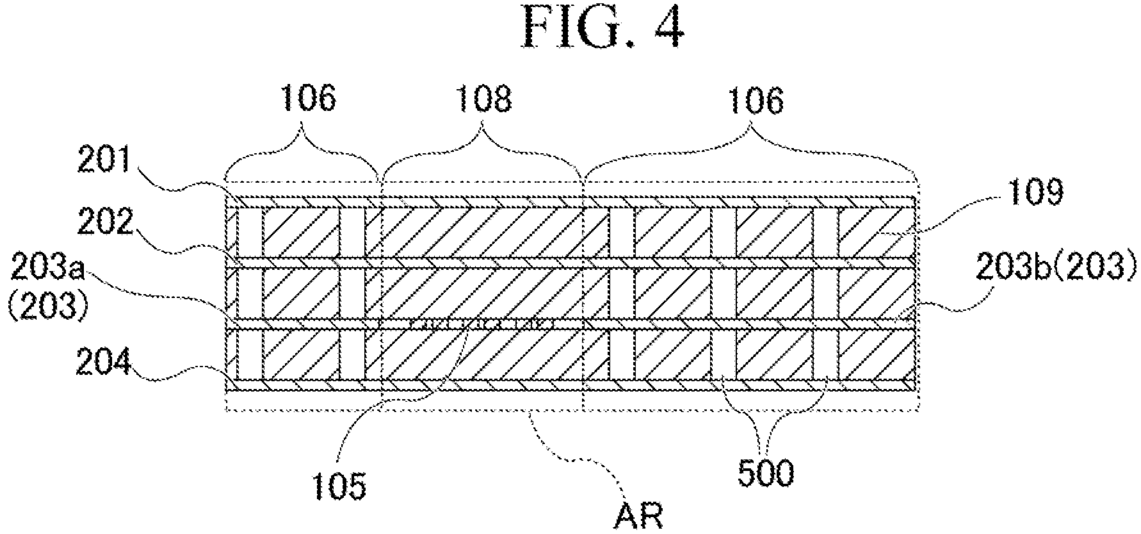
FIG. 4 is a cross-sectional view around a traversing portion of a drive current wiring having a battery GND potential according to Embodiment 1.
Figure 5:
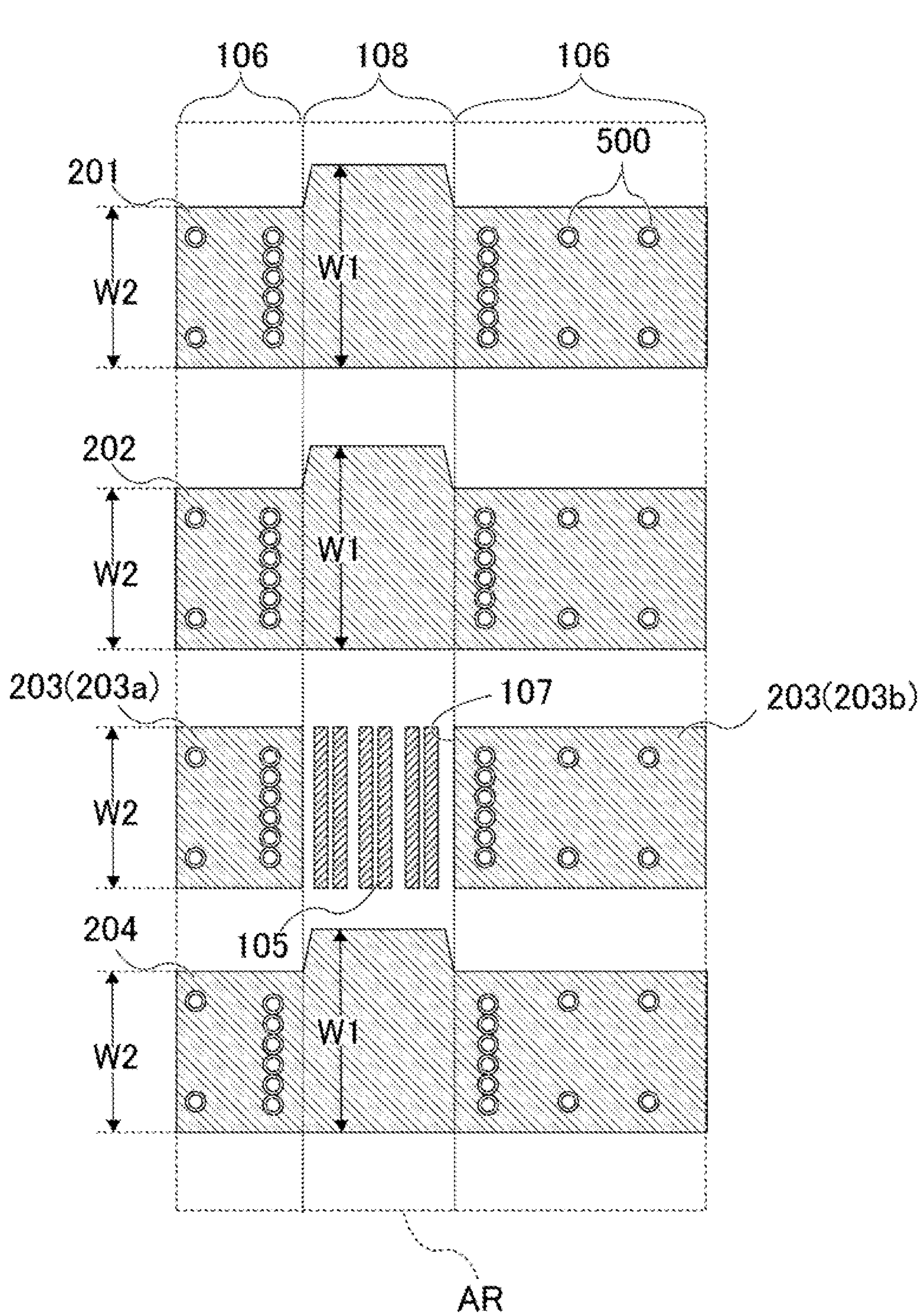
FIG. 5 is a plan view of each layer around the traversing portion of the drive current wiring having the battery GND potential according to Embodiment 1.
Figure 6:
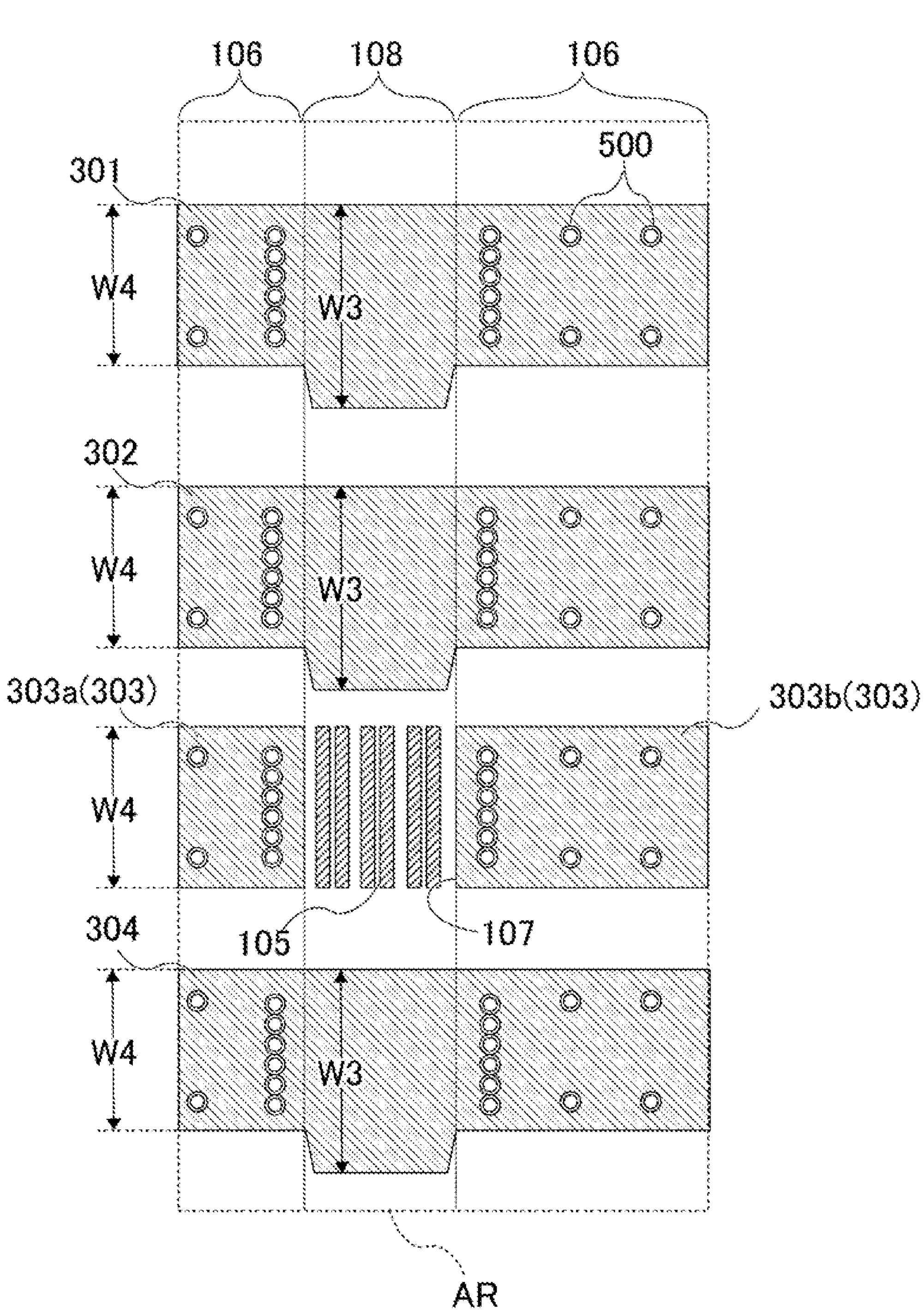
FIG. 6 is a plan view of each layer around the traversing portion of the drive current wiring having a battery voltage potential according to Embodiment 1.

As shown in FIGS. 4 to 6, the drive current wiring 100 includes a same shape portion 106 and a traversing portion 108. The same shape portion 106 is a portion in which the wirings of all layers are formed in the same shape. A notch portion 107 is formed in any of the layers in the traversing portion 108 in order to traverse the signal wiring 105 for controlling the inverter circuit 4. In the present embodiment, the notch portion 107 is formed in wirings 203 and 303 of the third layer. In Embodiment 1, the signal wiring 105 includes wirings connected to the switching elements 31 and 32 of the inverter circuit 4. The signal wiring 105 also includes a wiring connected to both terminals of the shunt resistor 36 that detects the current flowing through the inverter circuit 4.

The drive current wiring 100 includes a first drive current wiring (first drive current wiring) 200 having a GND potential of the battery 9 and a second drive current wiring (second drive current wiring) 300 having a battery voltage potential. The first drive current wiring 200 and the second drive current wiring 300 are formed in parallel along the through hole 39 of the circuit board 16 on the power section 3 side. The second drive current wiring 300 of the first drive current wiring 200 and the second drive current wiring 300 is formed on the power section 3 side. As a result, the battery voltage can be directly connected to the drain terminal of the high-side switching element 31 in the first layer. Thus, it is easy to dispose a wiring up to a motor connection portion 43U at the outer peripheral portion of the circuit board 16 and the high-side switching element 31, and dispose the low-side switching element 32 and the motor relay switching element 34. The disposition of the first drive current wiring 200 and the second drive current wiring 300 may be interchanged.

In addition, since the inverter circuit 4 is connected to the GND potential of the battery 9, in the arrangement in Embodiment 1, the first drive current wiring 200 to which the negative electrode of the shunt resistor 33 of the inverter circuit 4 is connected is required to cross the second drive current wiring 300.

Therefore, as shown in FIG. 3A, one electrode of the jumper component 36U is connected to the negative electrode of the shunt resistor 33U and three-dimensionally crosses the second drive current wiring 300. The other electrode of the jumper component 36U is connected to the first drive current wiring 200 of the inverter circuit 4. The jumper component 36U is a copper conductor, for example, and is formed to have a thickness and a conductor width that enable a desired current to be applied.

The switching elements 31, 32, and 34 and the shunt resistor 33 of the inverter circuit 4 are mounted from the control calculation section 2 with the drive current wiring 100 interposed therebetween. Therefore, the motor current detection signal wiring 105 for monitoring the voltage between both ends of the shunt resistor, a drive signal wiring (not shown) for the switching element, a signal wiring (not shown) for detecting the motor terminal voltage of each phase, and the like are required to bypass or traverse the drive current wiring 100.

FIGS. 4 and 5 are diagrams of a peripheral region AR in which the current detection signal wiring (signal wiring) 105 in FIG. 3C traverses the drive current wiring 100. FIG. 4 is a cross-sectional view and a plan view of each layer of the first drive current wiring 200. FIG. 5 is a cross-sectional view and a cross-sectional view of each layer of the first drive current wiring 200.

Similar to the drive current wiring 100, the wirings of the layers are referred to as a wiring 201, a wiring 202, a wiring 203, and a wiring 204 in order from the first layer. The wirings 201 to 204 in the layers are electrically connected through through holes 500.

FIG. 6 is a plan view of each layer of the second drive current wiring 300. First, as shown in FIGS. 4 and 5, the configuration of the drive current wiring 100 according to Embodiment 1 will be described in detail by using the first drive current wiring 200 in the region AR as an example.

The wiring 201 of the first layer, the wiring 202 of the second layer, and the wiring 204 of the fourth layer have the same shape. On the other hand, the notch portion 107 is formed at the wiring 203 of the third layer, and wirings 203*a* and 203*b* are formed with the notch portion 107 interposed therebetween. A notched region is referred to as the traversing portion 108, and the other region is referred to as the same shape portion 106. In Embodiment 1, the wiring 203 of the third layer is notched. The notch portion 107 may be formed in the wiring of any other layer. The notch portion 107 may be formed in wirings of a plurality of layers.

At the traversing portion 108 in FIG. 5, the wiring 203 of the third layer of the first drive current wiring 200 is notched, and the motor current detection signal wiring 105 is formed to traverse the first drive current wiring 200. At this time, the width W1 of the wiring 201 of the first layer, the wiring 202 of the second layer, and the wiring 204 of the fourth layer, which are not notched in the traversing portion 108, are formed to be larger than the width W2 of the wiring 201 of the first layer, the wiring 202 of the second layer, the wiring 203 of the third layer, and the wiring 204 of the fourth layer in the same shape portion 106. The width of the wiring is the dimension of the width in a direction perpendicular to the longitudinal direction of the wiring.

The second drive current wiring 300 is similar to the first drive current wiring 200.

As shown in FIG. 6, similar to the drive current wiring 100, wirings of the layers are referred to as a wiring 301, a wiring 302, a wiring 303, and a wiring 304 in order from the first layer. The wirings 301 to 304 in the layers are electrically connected through the through holes 500.

The wiring 301 of the first layer, the wiring 302 of the second layer, and the wiring 304 of the fourth layer have the same shape. The notch portion 107 is formed at the wiring 303 of the third layer, and wirings 303*a* and 303*b* are formed with the notch portion 107 interposed therebetween. A notched region is referred to as the traversing portion 108, and the other region is referred to as the same shape portion 106. In Embodiment 1, the wiring 303 of the third layer is notched. The notch portion 107 may be formed in the wiring of any other layer. The notch portion 107 may be formed in wirings of a plurality of layers.

At the traversing portion 108 in FIG. 6, the wiring 303 of the third layer of the second drive current wiring 300 is notched, and the motor current detection signal wiring 105 is formed to traverse the second drive current wiring 300. At this time, the width W3 of the wiring 301 of the first layer, the wiring 302 of the second layer, and the wiring 304 of the fourth layer, which are not notched in the traversing portion 108, are formed to be larger than the width W4 of the wiring 301 of the first layer, the wiring 302 of the second layer, the wiring 303 of the third layer, and the wiring 304 of the fourth layer in the same shape portion 106.

In Embodiment 1, the width W1 of the wiring 201 of the first layer, the wiring 202 of the second layer, and the wiring 204 of the fourth layer in the traversing portion 108 is formed to be approximately 4/3 times the width W2 of the wiring 201 of the first layer, the wiring 202 of the second layer, the wiring 203 of the third layer, and the wiring 204 of the fourth layer in the same shape portion 106. Here, since the wiring resistance of each layer of the wiring 201 of the first layer to the wiring 204 of the fourth layer in the same shape portion 106 is equal, when the wiring resistance is set as R, the combined resistance R106 of all the layers in the same shape portion 106 is R/4. On the other hand, the width W1 of the wiring 201 of the first layer, the wiring 202 of the second layer, and the wiring 204 of the fourth layer in the traversing portion 108 is 4/3 times that in the same shape portion 106. Thus, the resistance value of each layer is (R×3)/4, and the combined resistance R108 of the three layers other than the third layer in the traversing portion 108 is R/4, which is equal to the combined resistance R106 of the same shape portion 106.

The same applies to the second drive current wiring 300. The width W3 of the wiring 301 of the first layer, the wiring 302 of the second layer, and the wiring 304 of the fourth layer in the traversing portion 108 is formed to be approximately 4/3 times the width W4 of the wiring 301 of the first layer, the wiring 302 of the second layer, the wiring 303 of the third layer, and the wiring 304 of the fourth layer in the same shape portion 106.

Here, when all the drive current wirings 100 are formed to have the same shape in all layers, a board area is required for the signal wiring to bypass the drive current wiring 100, which makes it difficult to reduce the size of the circuit board.

On the other hand, the drive current wiring 100 has the same shape in all layers, thereby reducing the wiring resistance value in all layers. Therefore, when the current detection signal wiring 105 traverses any of the layers by notching the layer, the wiring resistance value in all the layers at the notch portion increases as compared to the same shape portion, and the heat generated in the wiring locally increases. Therefore, even though the size of the circuit board can be reduced by avoiding bypassing of the signal wiring, it is difficult to apply a large current to the drive current wiring 100.

Therefore, in Embodiment 1, the drive current wiring 100 includes the same shape portion 106 formed in the same shape in the wirings 201 to 204 and 301 to 304 of the conductor layers, and the traversing portion 108 in which the notch portion 107 is formed in at least one layer of the wirings 201 to 204 and 301 to 304 in the conductor layers by notching the portion of the drive current wiring 100. The dimension of the width W1 of the traversing portion 108 in the direction perpendicular to the longitudinal direction of the drive current wiring 100, in which the signal wiring 105 for transmitting the control signal of the inverter circuit 4 mounted in the power section 3, traverses the notch portion 107 is larger than the dimension of the width W2 in the same shape portion 106.

As a result, since the current value of the drive current for driving the motor 5 is large, a large current is applied to the drive current wiring 100, but it is possible to apply a large current to the drive current wiring 100 without increasing heat generation due to an increase in resistance value of the traversing portion even when the signal wiring 105 is formed in the drive current wiring 100 by traversing the signal wiring 105.

Further, by forming many through holes in the drive current wiring 100, the heat generated in the wiring of each layer is transferred from the lower portion of the board to the unit case 17 via the heat dissipation member 37, thereby improving the heat dissipation.

At this time, when the through hole is formed over the entire surface of the drive current wiring 100, the surface area of each layer is reduced and the resistance value is increased, resulting in increased heat generation from the wiring. In Embodiment 1, since the plurality of through holes 500 are formed only along the outer edge portion of the drive current wiring 100, it is possible to secure the required wiring area while securing the heat dissipation of the drive current wiring 100.

Figure 7:
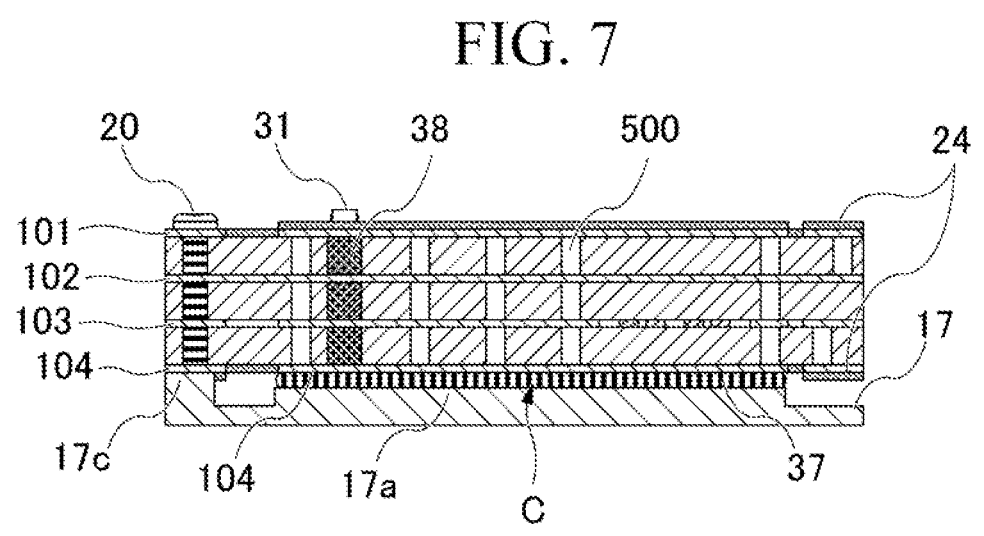

Further, as shown in FIG. 7, a protective film 24 is provided in the portion other than the contact portion C in which the circuit board 16 and the heat dissipation member 37 are in contact with each other, on the drive current wiring 104 of the fourth layer. That is, by selectively not forming the protective film 24 on the surface of the drive current wiring 104 of the fourth layer in contact with the protruding portion 17*a* facing the power section 3 of the circuit board 16 of the unit case 17, heat dissipation from the drive current wiring 100 to the unit case 17 is further enhanced. In Embodiment 1, the material of the protective film is resin.

Hitherto, although the contents of the present disclosure have been specifically described above with reference to the preferred embodiments, those skilled in the art can adopt various modifications based on the basic technical idea and teaching of the present disclosure.

The embodiments can be combined, and each embodiment can be modified or omitted as appropriate.

REFERENCE SIGNS LIST

1: Drive control device
2: Control calculation section
3: Power section
4: Inverter circuit
5: Motor
10: CPU (control device)
11: Drive circuit 12: Input circuit
16: Circuit board
31U, 32U: Switching element
33U: Shunt resistor
36U: Jumper component
100: Drive current wiring
105: Current detection signal wiring (signal wiring)
200: Drive current wiring having battery GND potential
200: First drive current wiring (first drive current wiring)
300: Second drive current wiring (second drive current wiring)
500: Through hole
106: Same shape portion
108: Traversing portion
600: Motor unit for electric power steering

The invention claimed is:

1. A multilayer circuit board formed by alternately stacking conductor layers and insulating layers, wherein a power section, in which a current is applied to an inverter circuit to which a switching element is mounted, and a control calculation section, to which a control device that controls the switching element is mounted, are disposed in different regions on the multilayer circuit board, the power section includes a drive current wiring for applying a current, the drive current wiring includes a same shape portion formed in a same shape in each of the conductor layers and a traversing portion in which a notch portion formed by notching a portion of the drive current wiring is formed at least on any one of the conductor layers, a signal wiring for transmitting a control signal of the inverter circuit mounted in the power section traverses the notch portion, and a dimension of a width of the traversing portion in a direction perpendicular to a longitudinal direction of the drive current wiring is larger than a dimension of a width of the same shape portion; wherein the drive current wiring includes a first drive current wiring and a second drive current wiring, the first drive current wiring being connected to a battery and having a battery voltage potential, and the second drive current wiring having a GND potential, and the first drive current wiring and the second drive current wiring are formed in parallel.

2. The multilayer circuit board according to claim 1, wherein the signal wiring includes a wiring connected to the switching element of the inverter circuit.

3. The multilayer circuit board according to claim 1, wherein the signal wiring includes a wiring connected to both terminals of a shunt resistor for detecting a current flowing through the inverter circuit.

4. The multilayer circuit board according to claim 1, wherein the drive current wiring includes a plurality of through holes only in an outer edge portion of the multilayer circuit board.

5. The multilayer circuit board according to claim 1, wherein a metal body is buried under the switching element of the inverter circuit.

6. The multilayer circuit board according to claim 1, wherein a heat dissipation member that dissipates heat from the multilayer circuit board and is in contact with the multilayer circuit board is provided, and a protective film is provided in a portion other than a contact portion in which the multilayer circuit board and the heat dissipation member are in contact with each other, on the multilayer circuit board.

7. The multilayer circuit board according to claim 1, further comprising:

a jumper component for performing wiring by three-dimensionally crossing the drive current wiring.

8. A drive control device comprising:

the multilayer circuit board according to claim 1.

9. A motor unit for electric power steering, the motor unit comprising:

the drive control device according to claim 8.

10. A drive control device comprising:

the multilayer circuit board according to claim 2.

11. A drive control device comprising:

the multilayer circuit board according to claim 3.

12. A drive control device comprising:

the multilayer circuit board according to claim 2.

13. A drive control device comprising:

the multilayer circuit board according to claim 5.

14. A drive control device comprising:

the multilayer circuit board according to claim 6.

15. A drive control device comprising:

the multilayer circuit board according to claim 7.

* * * * *